(12) United States Patent
Moll et al.

(10) Patent No.: US 9,023,709 B2
(45) Date of Patent: May 5, 2015

(54) TOP CORNER ROUNDING BY IMPLANT-ENHANCED WET ETCHING

(71) Applicant: GLOBALFOUNDRIES Inc., Grand Cayman (KY)

(72) Inventors: Hans-Peter Moll, Dresden (DE); Marco Lepper, Dresden (DE); Werner Graf, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 70 days.

(21) Appl. No.: 14/011,413

(22) Filed: Aug. 27, 2013

(65) Prior Publication Data

US 2015/0064872 A1    Mar. 5, 2015

(51) Int. Cl.
*H01L 21/00* (2006.01)
*H01L 21/3205* (2006.01)
*H01L 21/288* (2006.01)
*H01L 21/768* (2006.01)

(52) U.S. Cl.
CPC ........ *H01L 21/32051* (2013.01); *H01L 21/288* (2013.01); *H01L 21/76859* (2013.01)

(58) Field of Classification Search
CPC ............ H01L 21/288; H01L 21/32051; H01L 21/76859
See application file for complete search history.

(56) References Cited

U.S. PATENT DOCUMENTS

| 6,458,656 | B1 * | 10/2002 | Park et al. ...................... 438/257 |
| 6,780,722 | B2 * | 8/2004 | Peake ............................. 438/301 |
| 2002/0061623 | A1 * | 5/2002 | Hshieh et al. ................. 438/268 |

* cited by examiner

*Primary Examiner* — Richard Booth
(74) *Attorney, Agent, or Firm* — Amerson Law Firm, PLLC

(57) ABSTRACT

When forming metallization layers of advanced semiconductor devices, one often has to fill apertures with a high aspect ratio with a metal, such as copper. The present disclosure provides a convenient method for forming apertures with a high aspect ratio in an insulating layer. This insulating layer may have been deposited on the surface of a semiconductor device. The proposed method relies on an ion implantation step performed on the insulating layer, followed by an etch, which is preferably a wet etch.

22 Claims, 15 Drawing Sheets

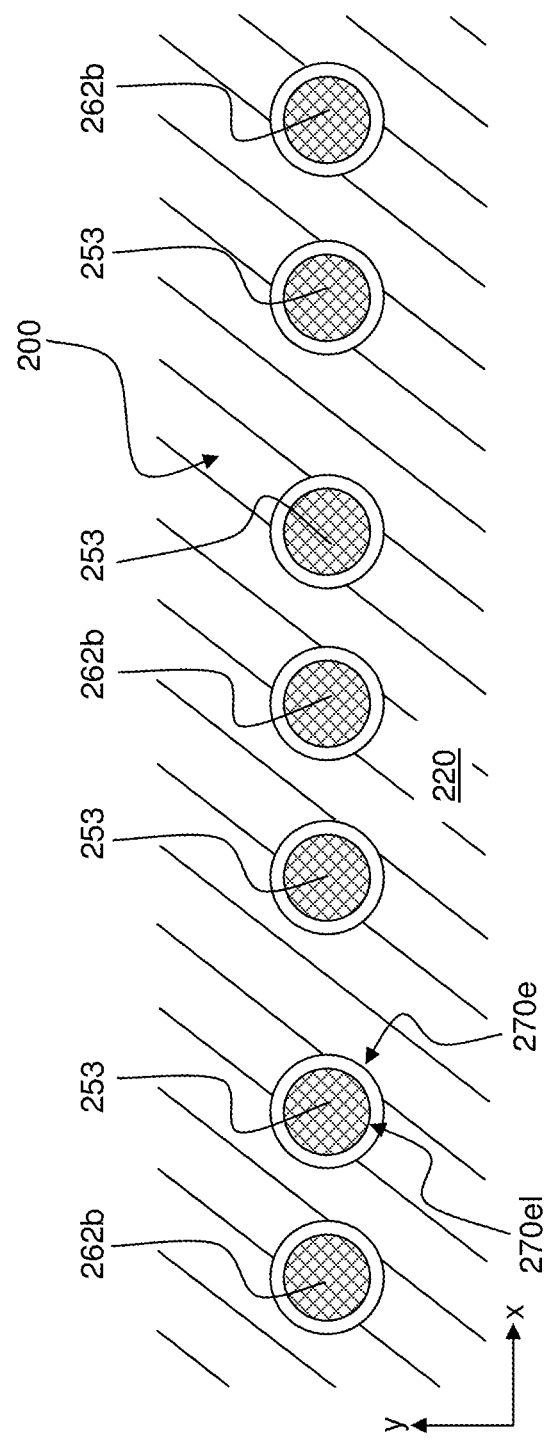

TOP CORNER ROUNDING BY IMPLANT-ENHANCED WET ETCHING

BACKGROUND OF THE INVENTION

1. Field of the Invention

The present disclosure generally relates to methods for fabricating integrated circuits, and, more specifically, to the formation of metallization layers including highly conductive metals into a dielectric material deposited on the surface of an integrated circuit.

2. Description of the Related Art

The ongoing trend in electronics towards more and more complex integrated circuits requires the dimensions of electronic devices to decrease, in order to achieve a higher and higher integration density.

In a typical electronic device included in an integrated circuit, transistors are the dominant circuit elements. Currently, several hundred millions of transistors may be provided in presently available complex integrated circuits, such as microprocessors, CPUs, storage chips and the like. It is then crucial that the typical dimensions of the transistors included in an integrated circuit are as small as possible, so as to enable a high integration density.

Due to the large number of circuit elements and the consequently complex layout of the integrated circuits, electrical connections to the individual circuit elements are generally not established within the same level on which the circuit elements are manufactured. In current integrated circuits, electrical connections are rather formed in one or more additional dedicated layers, also referred to as "wiring layers" or "metallization layers."

Metallization layers may include metal-containing lines providing in-level electrical connection across a single layer. Furthermore, metallization layers may also include a plurality of inter-level connections, also referred to as vias. A via may be implemented by forming a hole connecting to predetermined metallization layers and by subsequently filling the hole with a metal having a high electrical conductivity.

The continuous shrinkage of feature sizes of circuit elements in modern integrated circuits causes the number of circuit elements for a given chip area to steadily increase, thereby allowing for an increase in packing density. As the packing density increases, the number of electrical interconnections is simultaneously required to increase in order to provide the desired circuit functionality. Thus, as the number of circuit elements per chip area becomes larger, the number of stacked metallization layers is to increase, thus calling for a reduction of the dimensions of metallization lines and vias.

The fabrication of a plurality of metallization layers entails extremely challenging issues to be solved, such as mechanical, thermal and electrical reliability of a plurality of stacked metallization layers. As the complexity of integrated circuits advances, the need arises for conductive lines that can withstand moderately high current densities. In order to meet this ever more urgent need, semiconductor manufacturers are increasingly replacing the well-known metallization metal aluminum with metals that allow for higher current densities, so as to be able to reduce the dimensions of the interconnections and, consequently, the number of stacked metallization layers.

For example, copper has been found to be a viable candidate for replacing aluminum due to its higher resistance against electromigration and significantly lower electrical resistivity as compared to aluminum. Despite these advantages, copper also exhibits a number of drawbacks related to processing and handling in a semiconductor facility. For instance, copper may not be efficiently applied onto a substrate in larger amounts by well-established deposition methods, such as chemical vapor deposition (CVD). Also, copper may not be effectively patterned by the usually employed anisotropic etch procedures. Furthermore, not only does copper rapidly diffuse into silicon, but it changes the electrical properties of silicon in such a way as to prevent transistors formed therein from functioning.

In order to overcome these obstacles, an effective technique for patterning copper in semiconductor devices has been recently developed called "damascene technique."

In conventional deposition, a layer of metal and photoresist are deposited on a substrate, e.g., on a silicon wafer. Unwanted metal is then etched away with an appropriate chemical, leaving the desired pattern. Next, the spaces between the lines or vias are filled with an insulator, and finally the entire substrate surface is polished to remove excess insulator.

Damascene patterning involves the same number of steps, but reverses the order of deposition. A dielectric layer is first formed on the surface of the substrate including the integrated circuit or device. A pattern of trenches and holes is then formed in the dielectric layer by etching. The metal is then deposited after forming the pattern in the dielectric layer. The trenches filled with metal then rise to metal lines for the in-layer electrical connections, whereas the holes with the metal deposited therein will form the vias for inter-layer connection. After the deposition of the desired metal, the excess material deposited on areas outside of the trenches and vias has to be removed, which is currently accomplished by chemical mechanical polishing (CMP), possibly in combination with electrochemical etch techniques.

In both conventional and damascene patterning, the process is usually repeated many times to form the alternating layers of lines and vias which form the complete wiring system of a silicon chip.

The dielectric material in which the copper-based metal is embedded may advantageously comprise a so-called low-k material, that is, a material having a relative permittivity significantly lower than "conventional" dielectric materials, such as silicon dioxide, silicon nitride and the like. In general, the relative permittivity of a low-k material is equal to or less than 3.0. However, a low permittivity usually comes together with a significantly reduced mechanical strength and stability. Therefore, in typical damascene techniques for forming low-k metallization layers, a capping layer is provided that ensures the mechanical integrity of the low-k dielectric material by acting as a polish stop layer during the removal of the excess metal.

The process of filling copper or copper alloys into highly scaled openings, such as trenches or vias, having aspect ratios (depth/diameter) of approximately 5 or even more for sophisticated integrated circuits, is an extremely challenging task for process engineers.

As previously noted, copper and its respective alloys cannot effectively be deposited by chemical or physical vapor deposition. Hence, copper-based metals are typically deposited by electrochemical techniques, such as electroless plating or electroplating. Although electrochemical techniques for depositing copper are well established in the field of manufacturing integrated circuit boards, completely new deposition techniques have been developed for the formation of copper-based metallization layers in accordance with the damascene technique. In particular, deposition processes are required in which trenches and vias are filled substantially from bottom to top with a minimum number of defects, such as voids in the metal filling the trenches and vias.

With reference to FIGS. 1a-1d, a typical conventional process flow will now be described in more detail so as to more clearly demonstrate the problems involved in forming highly scaled copper lines in a dielectric material.

FIG. 1a schematically shows a cross-sectional view of a semiconductor device 100 comprising a substrate 101, which may be provided in the form of a bulk silicon substrate, an SOI (silicon-on-insulator) substrate and the like. The substrate 101 may also represent a device layer having formed therein individual circuit elements, such as transistors, capacitors, lines, contact portions and the like. For convenience, any such circuit elements are not shown in FIG. 1a.

The semiconductor device 100 further comprises a dielectric layer 120 formed above the substrate 101. The dielectric layer 120 may represent a dielectric material enclosing the individual circuit elements. The dielectric layer 120 may also represent a portion of a lower-lying metallization layer, in which any metal-filled vias (not shown) may be embedded.

Depending on the specific design of the semiconductor device 100, the layer 120 may be comprised of a conventional dielectric material, such as silicon dioxide or silicon nitride, or may comprise a low-k dielectric material, such as, for instance, hydrogen-enriched silicon oxycarbide (SiCOH). Although not shown in the figures, the dielectric layer 120 can also represent a stack of insulating layers, wherein one or more than one metallization layer is formed. The stack may be comprised of an alternation of oxide layers, low-k material layers, capping layers, etc. The layers in the stack may be arranged depending on the structural and functional requirements of the semiconductor device 100.

FIG. 1a shows that the dielectric layer 120 right after deposition is a continuous film, free of voids or apertures. Subsequently, as shown in FIG. 1b, an etch process 181 may be carried out on the semiconductor device 100 in order to form apertures 170 in the dielectric layer 120. The apertures 170 are in general formed in predetermined positions, for example, by using an appropriately patterned resist mask (not shown) during the etch process 181.

The aperture 170 is shown in FIG. 1b as a hole or trench exposing a surface portion of the semiconductor substrate 101. However, the aperture 170 may extend by a smaller length than the total thickness of the dielectric layer 120. For example, the aperture 170 may extend through the dielectric layer 120 to a sufficient depth to expose a given metallization layer. Usually, the aperture 170 has a high aspect ratio, i.e., a high ratio of depth to length. In FIG. 1b, the depth and length of the aperture 170 are the dimensions of the trench along the horizontal and the vertical directions, respectively.

FIG. 1c schematically shows the semiconductor device 100 in a stage of the process flow following that shown in FIG. 1b. FIG. 1c shows the semiconductor device 100 after a metal film 140 has been deposited on its surface. If the metal film 140 comprises copper or a copper alloy, deposition may have been performed by electrochemical techniques. A conductive barrier layer 144 may have been formed on the surface of the dielectric layer 120 prior to the deposition of the metal film 140. The conductive barrier layer 144 has mainly the tasks of preventing metals, such as copper, from diffusing into the dielectric layer 120 and increasing adhesion of the metal onto the device surface.

During a typical deposition of a metal layer 140 by electroplating, the composition and the kinetics within an electrolyte bath are controlled so as to yield a highly non-conformal deposition behavior. In this manner, the metal, e.g., copper or a copper alloy, may be deposited from bottom to top within the aperture 170. For an aperture 170 having a high aspect ratio, even slight overhangs at the aperture edge 170e may lead to the creation of defects, such as voids 140v, within the aperture 170. Defects in the portion of the metal layer 140 filling the aperture 170 are undesirable, since they may cause concerns regarding the reliability of the metal-filled aperture 170.

FIG. 1d schematically shows the semiconductor device 100 with the excess material of the barrier layer 144 and the metal layer 140 removed. Removal of the excess material may be accomplished, as previously explained, at least partially by chemical mechanical polishing, during which a capping layer (not shown) may act as a stop layer. During the process of polishing the surface of the semiconductor device 100, a portion of the insulating layer 120 may also be etched.

Due to the voids 140v, the reliability of metallization layers is significantly affected. This is due to the fact that the corresponding line or via resulting from the metal-filled aperture 170 may have a reduced conductivity and may also exhibit increased current or temperature-induced material transport, i.e., electromigration, at elevated current densities as are typically encountered in highly scaled devices.

A solution to the problem of filling apertures having a high aspect ratio with a metal has been proposed in U.S. Pat. No. 8,101,524. The proposed method consists of performing a first etch process in the presence of a mask in order to form apertures in the insulating layer, removing the mask and performing a second etch process before depositing the metal in the apertures. The second etch process, typically consisting of a plasma-based etch, is performed in order to round the corners of the edges of the apertures formed by means of the first etch process. Whereas the first etch process is strongly anisotropic, a reduced anisotropic character may cause the second etch process to promote the desired effect of corner-rounding.

This method is not always satisfactory, since plasma etch may cause undesired effects, besides that of corner rounding. For example, a second plasma etch performed after forming the apertures may undesirably damage surface portions of the semiconductor device exposed through the apertures. This problem may, for example, arise when the apertures expose sensitive portions of the semiconductor substrate in and on top of which circuit elements are formed. In this case, a second plasma etch may erode portions of the substrate surface exposed through the aperture, thereby potentially causing damages to some circuit elements.

In view of the situation described above, there exists a need for an improved technique which allows one to solve or at least reduce the effects of one or more problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

The present disclosure is directed to techniques for improving the procedure of filling apertures of a dielectric layer having a high aspect ratio with a metal. The disclosure is based on the idea that an ion implantation may be performed on the surface of the dielectric layer after forming the apertures, so as to increase a wet etch rate of the layer portions affected by the implant. Thus, after performing the implantation, the dielectric layer may undergo a wet etch, which causes the implanted portions to be etched more deeply than the non-implanted portions. Since the ion implantations also affects the corners and edges of the aperture, the wet etch results in the edges of the apertures being smoothed and rounded.

Based on this idea, a method of forming a semiconductor device in and/or on a semiconductor substrate is provided. The method includes forming a transistor structure including a gate electrode, a source region and a drain region, forming an insulating layer on the surface of the substrate after forming the transistor structure, performing a first etch process in order to form at least one opening in a predetermined portion of the insulating layer, performing an ion implantation so as to implant impurity ions onto an upper portion of the insulating layer, and performing a second etch process so as to remove a surface portion of the insulating layer after performing the ion implantation. Thus, thanks to the presence of the ion implantation, the implanted portions undergo a different etch rate than portions which are free of implanted ions.

According to one embodiment, the second etch process is such that the etch rate of the dielectric layer is higher in those areas affected by the ion implantation and lower in areas unaffected by the ion implantation.

According to a further embodiment, the second etch process comprises a wet etch. In this manner, the second etch may include one of the standard cleaning procedures usually performed on the device surface. This is preferable to using a second plasma-based etch which might damage sensitive parts of the device.

According to still another embodiment, the direction of the ion beam used for performing the ion implantation forms an angle different from zero with the normal direction to the surface of the substrate. By performing a tilted ion implantation, the ion beam may be effectively directed so that the edges and the walls of the aperture may be implanted with impurities. Thus, the etch rate of the aperture edges may be increased during the etch process subsequently performed. An enhanced corner-rounding effect may thus be achieved.

BRIEF DESCRIPTION OF THE DRAWINGS

The disclosure may be understood by reference to the following description taken in conjunction with the accompanying drawings, in which like reference numerals identify like elements, and in which:

FIG. 4c shows a top view of the semiconductor device shown in FIG. 2e according to an embodiment.

Figure 1A:
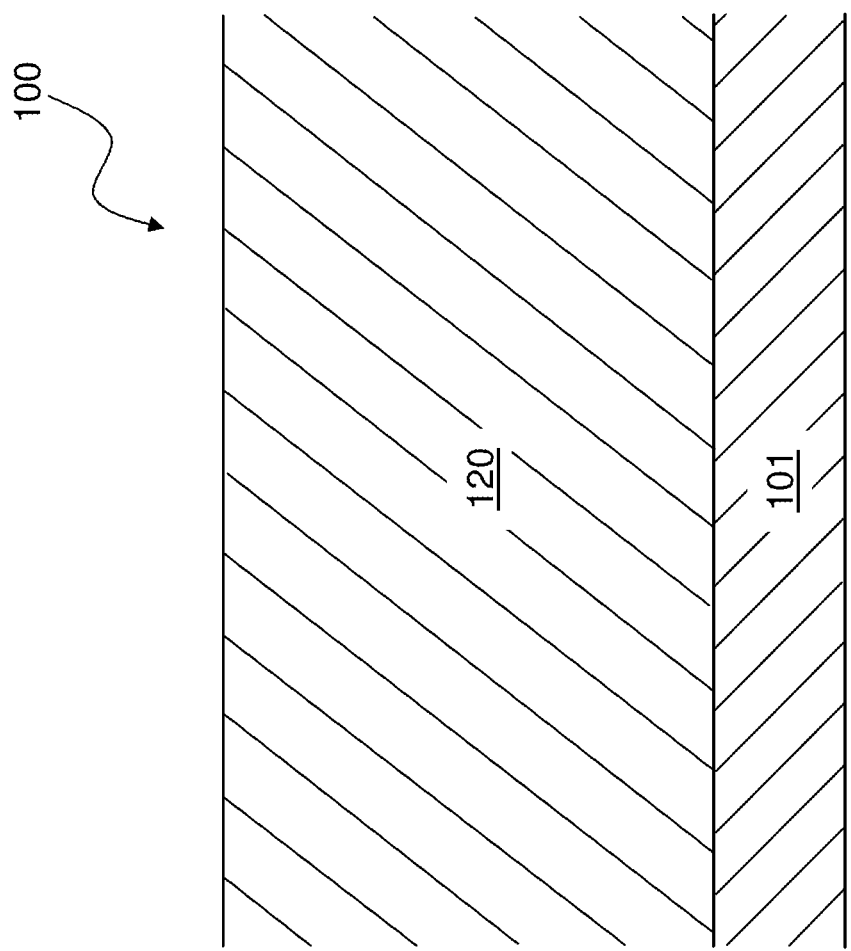
FIGS. 1a-1d schematically illustrate cross-sectional views of a semiconductor device during various manufacturing stages in forming a metal-filled aperture in a dielectric layer according to a conventional single damascene technique.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

It should be understood that, unless otherwise specifically indicated, any relative positional or directional terms that may be used in the descriptions below—such as "upper," "lower," "on," "adjacent to," "above," "below," "over," "under," "top," "bottom," "vertical," "horizontal" and the like—should be construed in light of that term's normal and everyday meaning relative to the depiction of the components or elements in the referenced figures. For example, referring to the schematic cross-section of the semiconductor structure 200 depicted in FIG. 2a, it should be understood that the gate electrode structure 260 is formed "above" the active region 202a and the semiconductor substrate 201. Similarly, it should also be noted that the dielectric layer 220 is formed above transistor structures 250 and semiconductor layer 202.

FIGS. 2a-2g show a semiconductor structure 200 and a method of fabrication thereof according to an embodiment of the present disclosure.

Figure 2A:
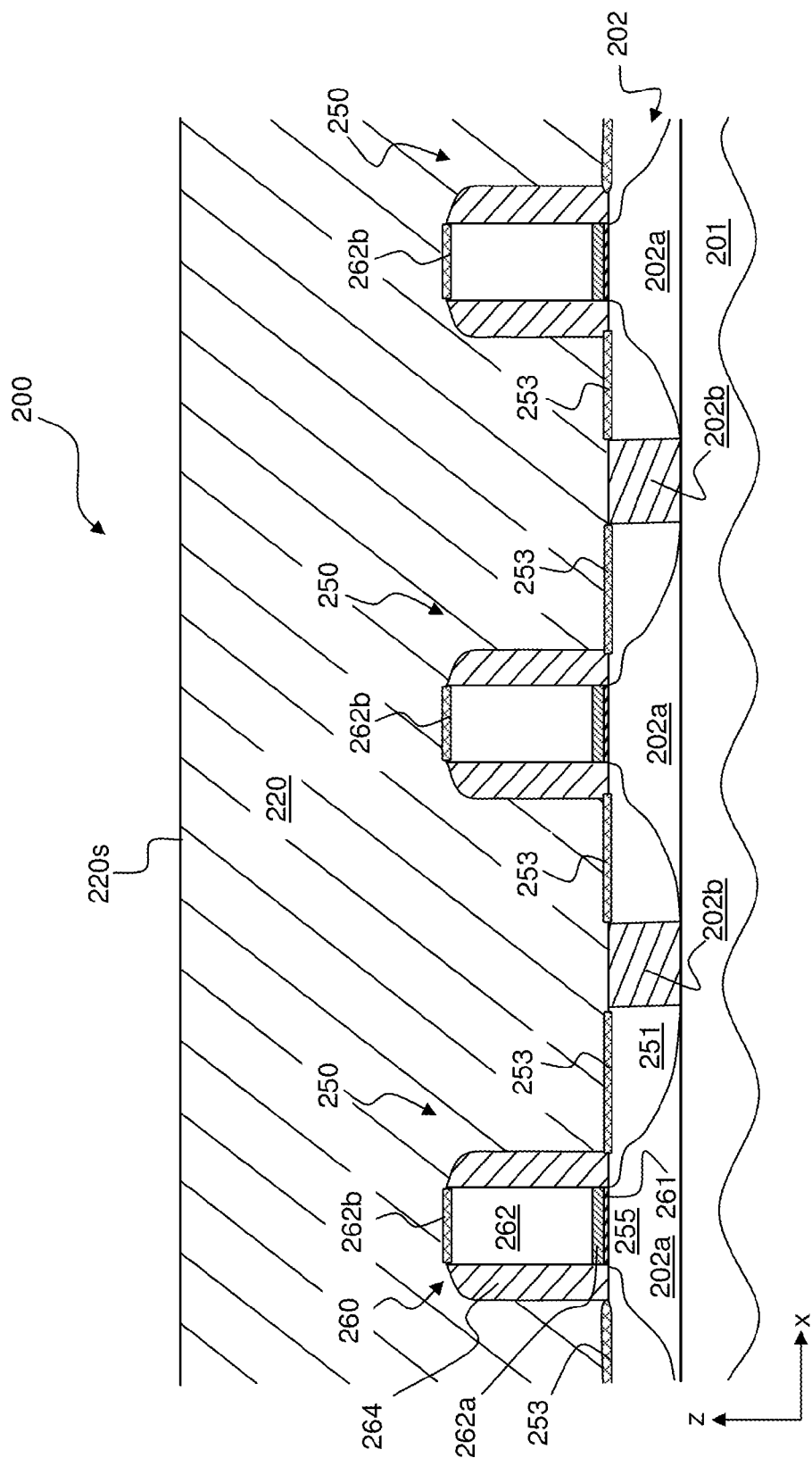
FIGS. 2a-2g schematically illustrate a sequence of cross-sectional views of a semiconductor device during subsequent stages of a manufacturing flow according to an embodiment.

FIG. 2a shows a semiconductor structure 200 in an advanced fabrication stage. The semiconductor structure 200 comprises a substrate 201, such as a semiconductor material and the like, above which a semiconductor layer 202 is formed. The substrate 201 and the semiconductor layer 202 may, depending on the device requirements, form a semiconductor-on-insulator (SOI) architecture. Alternatively, the semiconductor layer 202 may be formed as a portion of the substrate 201, which is then preferably comprised of a monocrystalline semiconductor. For example, the semiconductor layer 202 may comprise silicon. More specifically, the semiconductor layer 202 may comprise mono-crystalline silicon.

It is observed that the semiconductor layer 202 comprises an upper surface defining a plane which is parallel to a horizontal reference plane. In FIG. 2a, the horizontal and the vertical directions are parallel to the x-axis and the z-axis, respectively. Thus, the reference horizontal plane may be identified with the xy-plane, i.e., with a plane normal to the plane of FIG. 2a and passing for the origin of the Cartesian axes. It should be noted that expressions such as "above," "below," "upper" and "lower" are always referred to the positive direction of vertical axis z.

A plurality of active regions 202a have been formed in the semiconductor layer 202. The active regions 202a have to be intended as portions of the semiconductor layer 202 in and top of which an electronic component of the device 200 may be formed. The active regions 202a are delimited by isolation regions 202b. The isolation regions 202b could be, for example, implemented as shallow trench isolations.

One or a plurality of circuit elements may have been formed in the semiconductor layer 202. Circuit elements may comprise any active or passive elements. Examples of elements which may be formed in the semiconductor layer 202 include capacitors, inductors, transistors and the like. FIG. 2a shows a portion of the semiconductor device 200 wherein three transistors 250 have been formed partly in and partly on the semiconductor layer 202. Each transistor 250 has been formed in a respective active region 202a. For example, one or more of the transistors 250 may comprise a field effect transistor (FET).

Each transistor 250 includes a source region and a drain region 251. Source and drain regions 251 are formed by doping with impurities of a desired type some portions of the active regions 202a. After forming source and drain regions 251, a transistor channel region 255 is defined as the area of the active region 202a delimited by the source and drain regions 251.

Each transistor 250 also comprises a gate electrode structure 260 formed on the upper surface of the semiconductor layer 202. Each gate electrode structure 260 comprises a gate electrode material 262. The gate electrode material 262 may be, for example, polysilicon. Furthermore, the gate electrode structure 260 comprises an insulation layer 261 physically and electrically separating the gate electrode material 262 from the channel region 255. The gate electrode 260 may have any appropriate geometric configuration, for instance in terms of length and width. For example, the gate length, i.e., in FIG. 2a, the horizontal extension of the gate electrode material 162, may be 50 nm or less.

Depending on the configuration of the gate electrode structure 260, the insulation layer 261 may be formed in different ways. For example, if the gate electrode 260 is a conventional oxide/polysilicon gate electrode (e.g., poly/SiON), then the gate insulation layer 261 may be formed from a conventional gate dielectric material, such as, for example, silicon dioxide, silicon oxynitride and the like, whereas the gate electrode material 262 may comprise polysilicon.

Alternatively, the gate structure 260 may have been formed according to a high-k/metal gate (HKMG) approach. HKMG technology is usually preferred for gate lengths of about 50 nm or smaller. In this case, the insulation layer 261 may be one of the high-k gate dielectric materials well known in the art. For example, a non-exhaustive list of high-k materials which may be used in transistor gates has been given above.

The gate electrode structure 260 may also comprise a gate metal layer 262a, for instance in the form of tantalum nitride and the like, possibly in combination with a work function metal species, such as aluminum and the like. The gate metal layer 262a is typically formed above the insulation layer 261, thereby adjusting an appropriate work function and thus threshold voltage of the transistor 250. Furthermore, the gate electrode structure 260 may be laterally delimited by a spacer structure 264 which may comprise one or more dielectric materials, such as, for example, silicon nitride, silicon dioxide, silicon oxynitride and the like.

A metal semiconductor layer has then been formed on some portions of the surface of the transistors 250. The metal semiconductor layer typically comprises a metal silicide. More specifically, a metal semiconductor layer 262b is formed partly in and partly on top of the upper surface of the gate electrode material 262, whereas a metal semiconductor layer 253 is formed partly in and partly on top of the semiconductor layer 202. The metal semiconductor layers 253 and 262b, which may, for example, comprise nickel silicide, are used in order to electrically contact the source and drain regions 251 and the gate electrode material 262, respectively.

As shown in FIG. 2a, an insulating layer 220 is formed on the surface of the semiconductor layer 202 and of the circuit components formed thereon. Although shown as a single layer in the figure, it should be understood that the insulating layer 220 may comprise several different dielectric layers stacked upon each other. The insulating layer 220 may comprise, for example, a stressed material layer. A stressed material layer may be implemented by a silicon nitride ($Si_3N_4$) layer deposited on the surface of the semiconductor layer 202. The insulating layer 220 may further comprise an interlayer dielectric material. A typical interlayer dielectric material is, for example, silicon dioxide ($SiO_2$). This interlayer dielectric material layer may be deposited onto the stressed material layer or directly on the surface of the semiconductor layer 202 onto which the desired circuit element has been formed. For example, the insulating layer 220 may be an interlayer dielectric material layer formed on the surface of the transistor structures 250 shown in FIG. 2a.

Furthermore, the insulating material layer 220 may comprise one or more low-k material layers. Low-k material layers are advantageously used in order to decrease the parasitic capacitance between two metal lines lying close to each other. For example, one low-k material layer may have been deposited on and above an interlayer dielectric material layer. A low-k material layer may comprise, for example, silicon oxycarbide (SiCOH).

Although not shown in the figures, one or more metallization layers may have been formed in the insulating layer 220.

As shown in FIG. 2a, the insulating layer 220 is initially formed as a continuous, void-free layer. Thus, after being formed, the exposed surface 220s of the insulating layer 220 is substantially continuous and free from holes, apertures or interruptions in general. The upper surface 220s lies on a substantially horizontal plane parallel to the plane defined by the upper surface of the semiconductor layer 202.

Figure 2B:
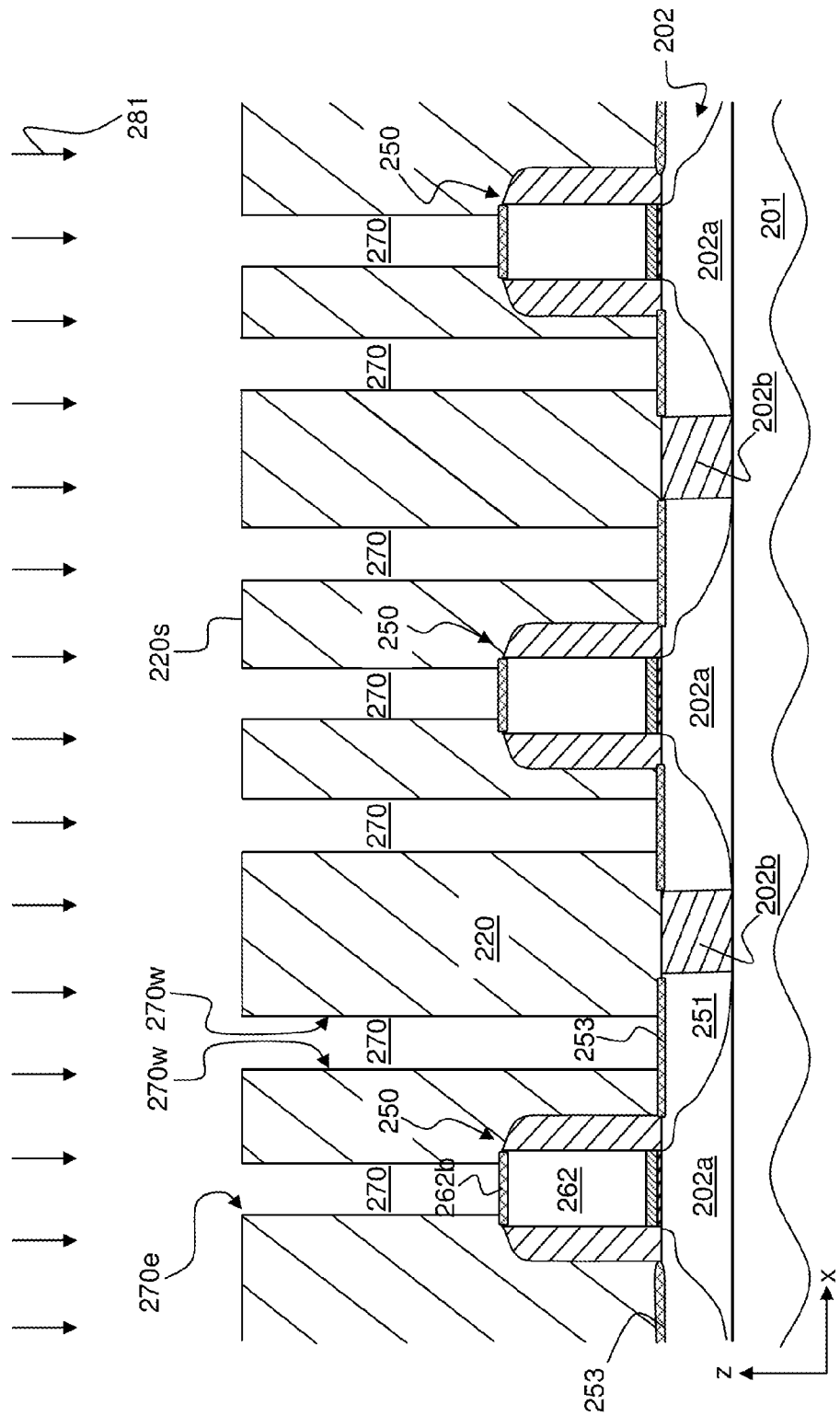

Subsequently, as shown in FIG. 2b, an etching process 281 is performed so as to form a number of apertures 270 across the insulating layer 220. According to one embodiment, the etching process 281 comprises an anisotropic etch. For example, the etching process 281 may comprise a reactive ion etching (RIE) process.

Apertures 270 are formed at predetermined positions of the surface of the insulating layer 220, for example by using a mask (not shown). The apertures 270 are laterally defined by side walls 270w. Furthermore, the apertures 270 are limited in their upper portion by edges 270e defined by the intersection between aperture side walls 270w and the upper surface portion 220s of the insulating layer 220, i.e., the portion of the surface of the insulating layer 220 lying on a horizontal plane parallel to the xy-plane.

The apertures 270 may be formed in order to expose a surface portion of a circuit element wherein an electrical contact pad has been formed. In this manner, an electrical signal or an electrical charge may be collected by electrically contacting the contact pad. The electrical signal or charge thus collected may then be transferred to the outside of the semiconductor device or to other areas thereof. The apertures 270 may also be formed in order to electrically connect two metallization layers lying at different levels on the vertical axis. Moreover, the apertures 270 may be formed in the insulating layer 220 when a metal line in a given metallization layer is to be created.

The apertures 270 are in general adapted to be filled with a metal, so as to provide electrical contact between designed points of the semiconductor device. For example, the apertures 270 may be filled with a highly conductive metal, such as copper. Alternatively, the apertures 270 may be filled with a metal or a metal alloy comprising, for example, aluminum or tungsten.

In the embodiment shown in FIG. 2b, the apertures 270 extend across the whole thickness of the insulating layer 220, thus exposing portions of the surface of transistors 250. In the particular embodiment shown in FIG. 2b, the apertures 270 leave exposed some portions of the metal semiconductor layers 253 and 262b, permitting the electrical contact with the source and drain regions 251 and with the gate electrode material 262, respectively. In general, any contact pad to any generic circuit element formed in and/or on top of the semiconductor layer 202 may be exposed through an aperture 270.

According to other embodiments not shown in the figures, the apertures 270 extend across the insulating layer 220 by a length which is less than the thickness of the insulating layer 220. In this case, the surface of the semiconductor layer 202 or of the circuit elements formed thereon is not exposed by the apertures 270. This embodiment is preferred when forming, for example, metal lines for in-level electrical connection or vias connecting two metallization layers lying above the surface of the semiconductor layer 202.

Due to the strong anisotropic character of etch 281, aperture side walls 270w lie along a substantially vertical direction. Furthermore, again due to the strong directionality of etch 281, edges 270e form sharp angles of approximately 90 degrees.

Figure 4A:
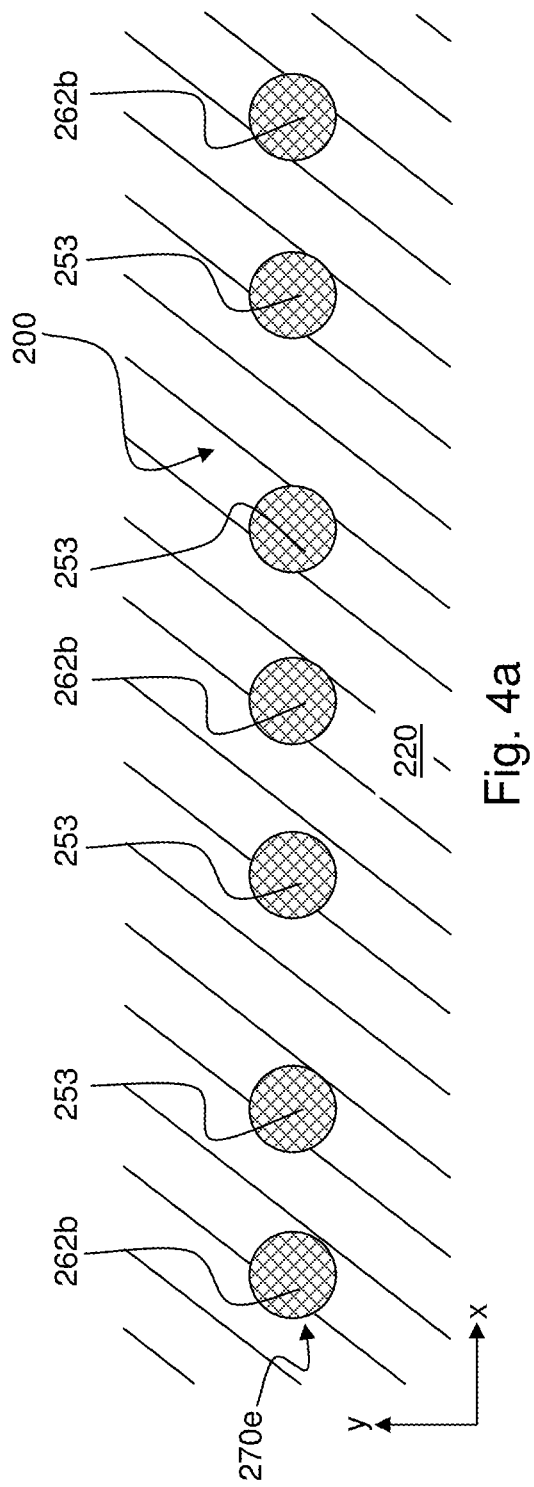
FIG. 4a shows a top view of the semiconductor device shown in FIG. 2b according to an embodiment.

The apertures 270 may have been formed so as to have any desired cross-section. FIG. 4a shows a top view of an embodiment of the semiconductor device 200 shown in FIG. 2b. In the embodiment shown in FIG. 4a, the apertures 270 have been formed so as to have a circular cross-section, thereby resulting in edges 270e of the aperture 270 having a circular profile. In this manner, the apertures 270 have a cylindrical symmetry with respect to their longitudinal axis. FIG. 4a also shows that apertures the 270 leave exposed to the outside some portions of metal silicide layers 253 and 262b. Thus, the apertures 270 may be used as holes for contacting the electrodes of a transistor 250 or of any other circuital element formed in and on top of the semiconductor layer 202.

According to other embodiments not shown in the figures, the apertures 270 may have a cross-section different from a circle. For example, the apertures 270 may have a square, rectangular, or generically polygonal cross-section. In particular, the apertures 270 may have a rectangular cross-section with a width much greater than their length. In this manner, the apertures 270 are adapted to form trenches which may be subsequently filled with a metal so as to give rise, for example, to metal lines in a metallization layer.

Figure 1B:
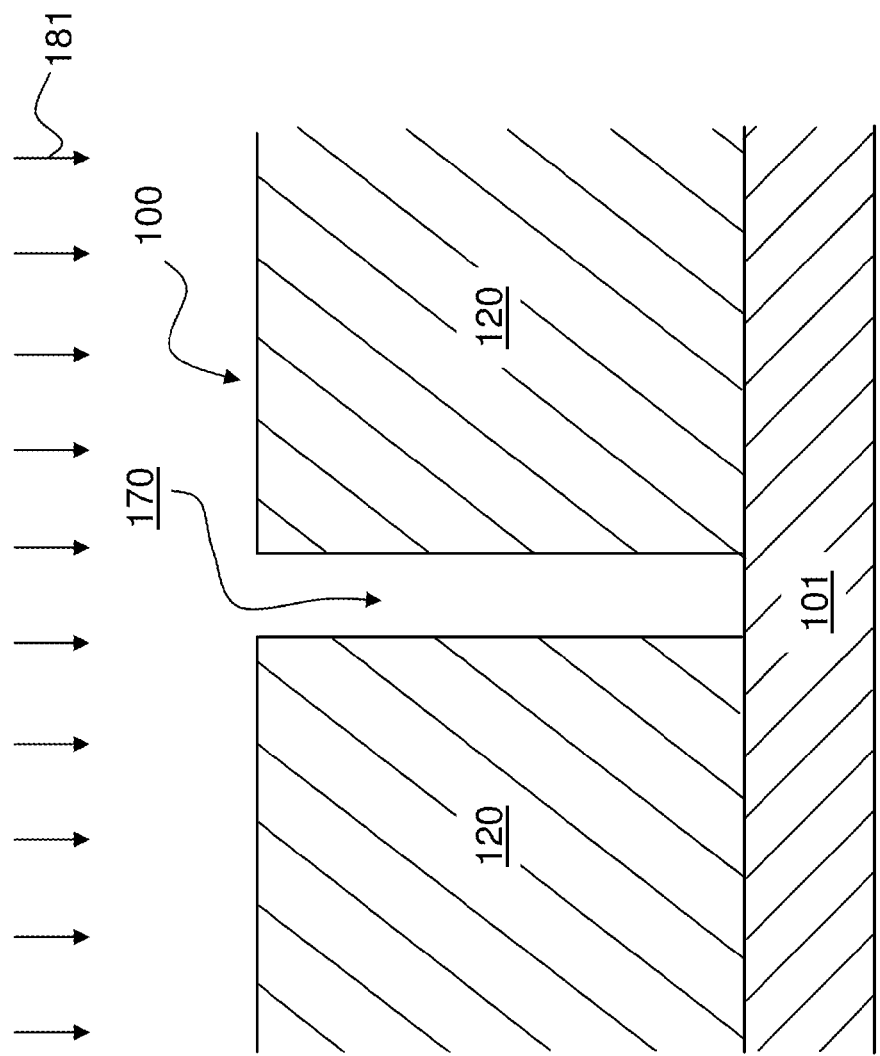
Figure 1C:
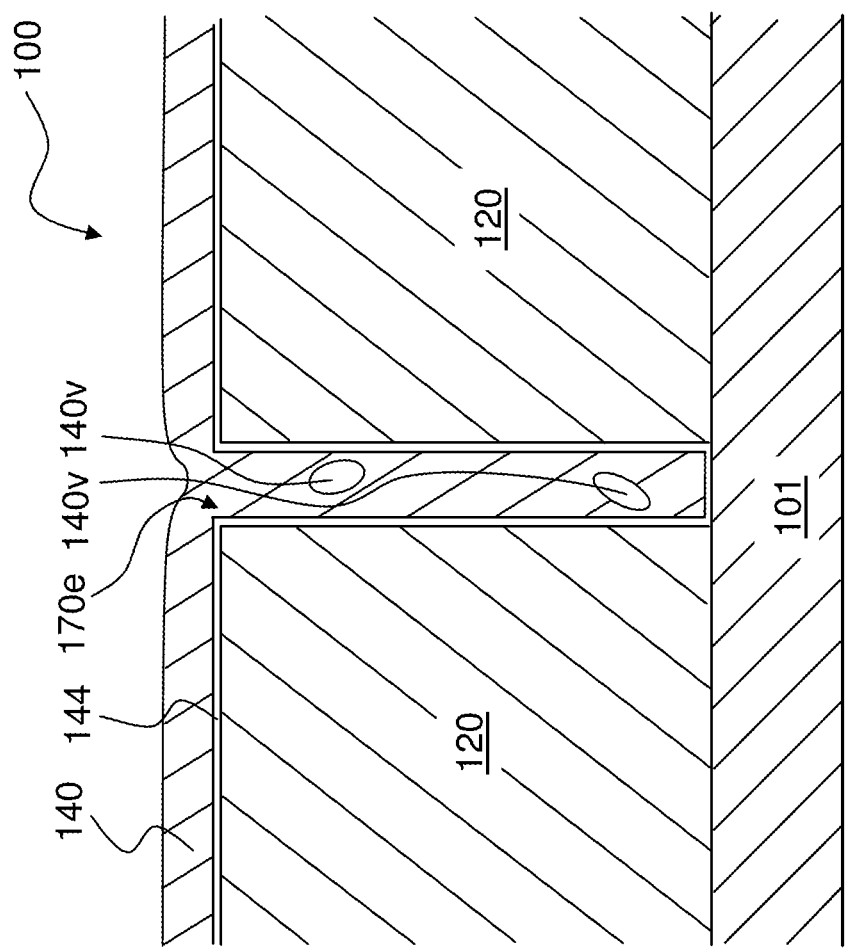
Figure 1D:
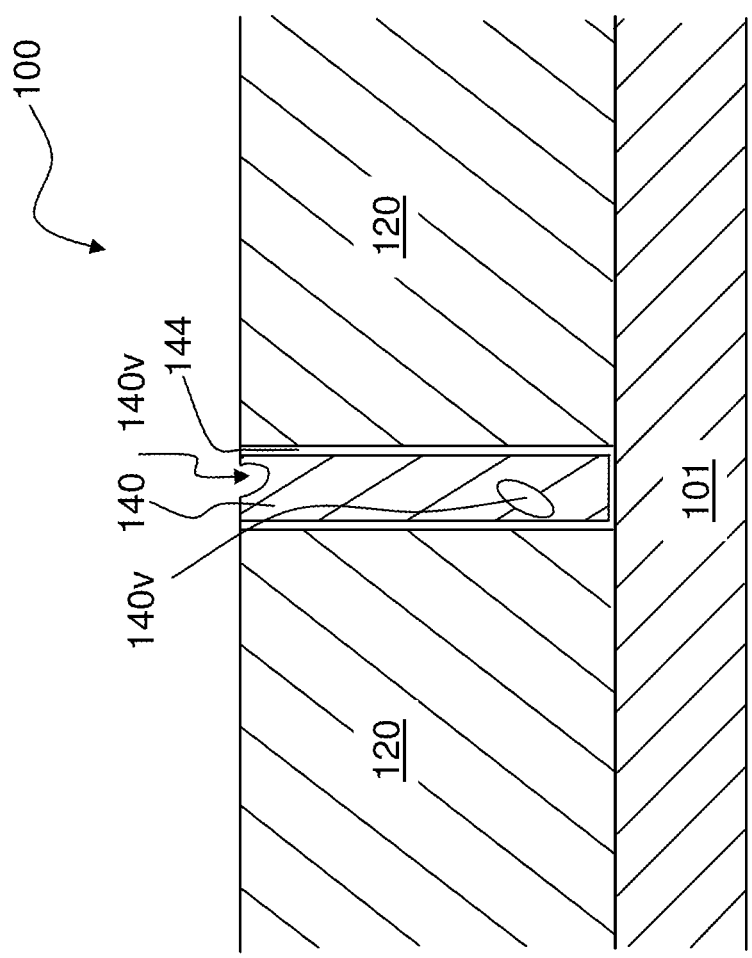

Again with reference to FIG. 2b, the apertures 270 have a height (dimension along the vertical direction parallel to z-axis) which is considerably greater than their length (dimension along the horizontal direction parallel to x-axis). The aspect ratio of the apertures 270, defined as the ratio of height to length, is typically equal to, or greater than 5. Due to this high aspect ratio, even small irregularities, such as overhangs, may jeopardize the process of metal deposition into the apertures 270, by, for example, causing formation of voids in the metal. This effect has been described above with reference to FIGS. 1b and 1c.

The present disclosure proposes a new advantageous method of forming apertures 270, in particular, apertures with a high aspect ratio. The method relies on an ion implantation followed by an etch process, as will be described with reference to FIGS. 2c-2e.

Figure 2C:
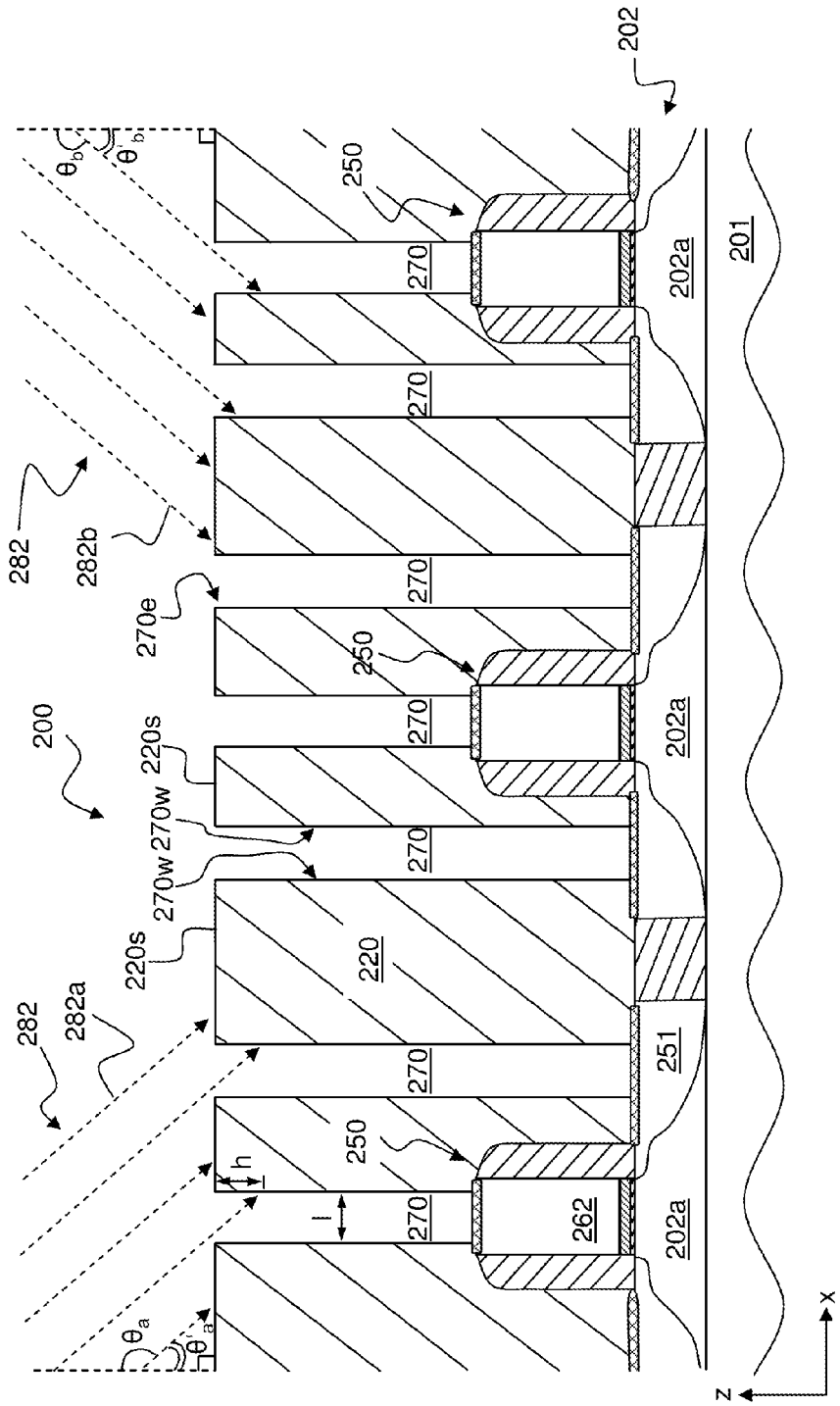

We now refer to FIG. 2c. After forming the apertures 270 by means of the etch process 281, an ion implantation 282 is performed on the semiconductor device 200. Since the semiconductor device 200 mainly exposes the surface of the insulating layer 220, the insulating layer 220 is mainly affected by the implantation 282.

Ion implantation 282 is performed in order that the etch rate of the portions of the insulating layer 220 affected by implantation 282 is increased with respect to the non-implanted portions, when the semiconductor device 200 is exposed to a second etch 284 which will be discussed in the following. Thus, depending on the materials making up the exposed surface of the semiconductor layer 220 and depending on the second etch process 284, different species may be implanted by means of the implantation 282.

For example, if the surface of the insulating layer 220 comprises $SiO_2$, germanium ions may be implanted, which increase the etch rate of $SiO_2$ in hydrofluoric acid (HF). If instead the surface of the insulating layer 220 comprises $Si_3N_4$, impurities such as carbon, silicon or nitrogen may be implanted, which are known to increase the etch rate of $Si_3N_4$ in phosphoric acid ($H_3PO_4$).

Nitrogen may also be implanted into insulating layers 220 comprising an oxide. According to experimental findings, a nitrogen implant with an energy of about 1-10 keV and a dose of $10^{13}$ to $10^{14}$ cm$^{-2}$ into an oxide impacts the wet etch rate. The selectivity of implanted oxide as compared to non-implanted oxide is high for slow oxide etch rate chemistry. This is especially the case when a hot wet etch is used, such as the procedure known as "standard cleaning 1" (SC1), as will be more extensively discussed in the following.

Beside nitrogen, other implant species could be used, since the etch rate is changed by a mechanical "amorphization" effect of the oxide. In addition, a chemical effect on the etch rate is determined by the implant species.

The main purpose of implantation 282 is causing smoothing of edges 270e of the apertures 270 by favoring a corner-rounding effect of the second etch process 284 to be performed after implantation 282. In order to achieve this goal, the effect of locally increasing the etch rate may be advantageously obtained in the portions of the surface of the insulating layer 220 lying within and around edges 270e of the apertures 270. It is, thus, desirable that impurity ions are implanted not only in the upper portion 220s of the surface of the insulating layer 270, but also in the upper end portion of the aperture walls 270w lying in the vicinity of aperture edges 270e.

Thus, according to one embodiment, implantation 282 is performed by using a tilted ion beam. In other words, the direction of the ion beam is not parallel to the vertical direction but forms with the vertical z-axis an angle which is different from 0° and from 180°.

Figure 3:
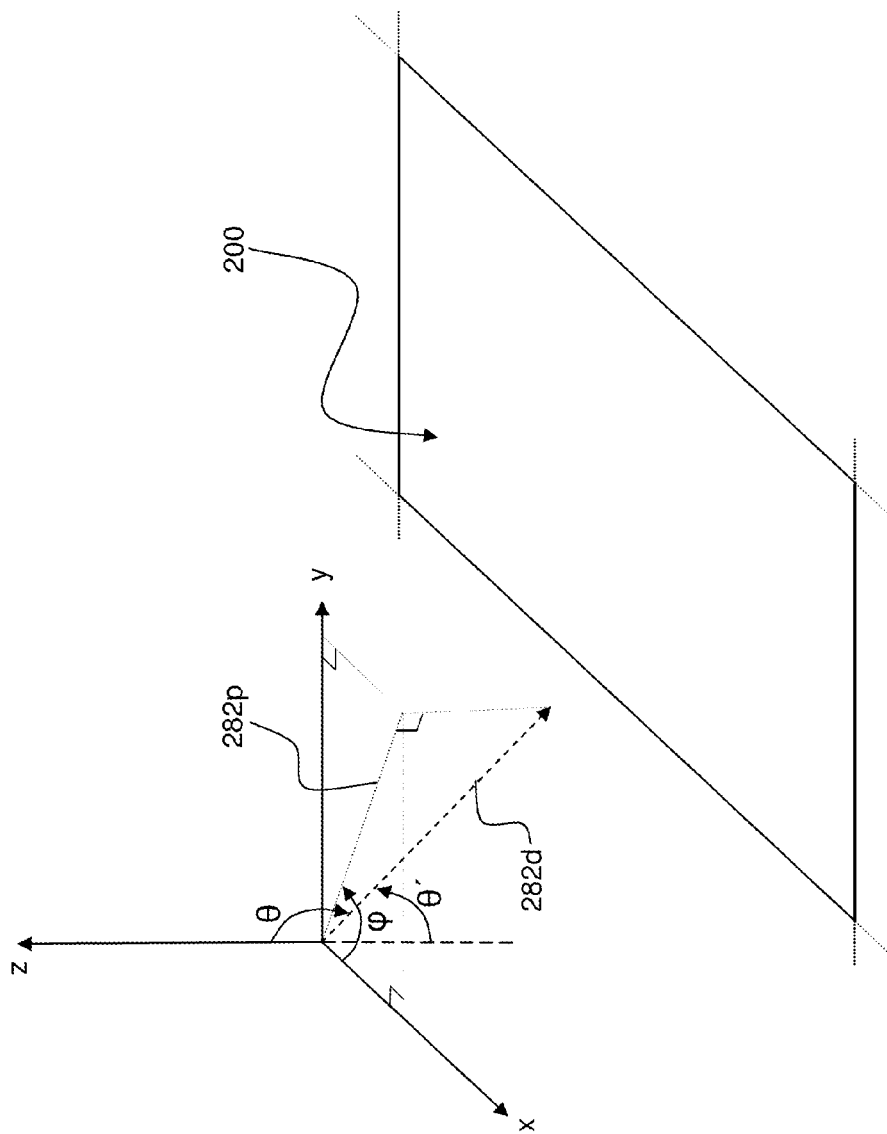
FIG. 3 illustrates a perspective view of the surface of a semiconductor and of the direction of the ion beam of an implantation according to the present invention, wherein some parameters defining the direction of the ion beam with respect to a set of Cartesian axes are indicated.

FIG. 3 is a perspective three-dimensional view showing the parameters used for defining the direction 282*d* in space along which the ion beam used in ion implantation 282 lies. Also shown in FIG. 3 is the approximate position of the surface of the semiconductor device 200 with respect to the ion beam used with implantation 282. In FIG. 3, the surface of the semiconductor device 200 is shown to lie approximately on a horizontal plane parallel to the xy-plane. In general, the ion beam of implantation 282 is above the surface of the semiconductor device 200 and the direction 282*d* of the ion beam is such that the ions to be implanted can impinge on the surface of the semiconductor device 200.

The direction 282*d* of the ion beam is identified by a pair of angles ($\theta$, $\phi$).

Angle $\theta$, called the "polar angle," is the angle formed by the ion beam direction 282*d* with respect to vertical z-axis. Polar angle $\theta$ is oriented in the direction going from the z-axis to the direction 282*d* of implantation 282. Due to the choice of the system of Cartesian axes, the direction 282*d* of implantation 282 in general forms a polar angle $\theta$ with vertical z-axis in the range of 90° to 180°. Of course, it would be equally possible to consider as polar angle an angle $\theta'$ supplementary to angle $\theta$. Then, angle $\theta'$ may vary in the range of 0° to 90°.

Angle $\phi$, called the "azimuth angle," is the angle formed by the orthogonal projection 282*p* of direction 282*d* onto the horizontal xy-plane with respect to the horizontal x-axis. Azimuth angle $\phi$ is oriented in the direction going from the x-axis to orthogonal projection 282*p*. In general, azimuth angle $\phi$ can vary in the range of 0° to 360°. Equivalently, the range of −180° to 180° may be used for azimuth angle $\phi$.

We now refer back to FIG. 2*c*. In the embodiment shown in FIG. 2*c*, implantation 282 comprises two implantations, 282*a* and 282*b*, performed with polar angles $\theta_a$ and $\theta_b$ (or complementary angles $\theta'_a$ and $\theta'_b$), respectively. In other embodiments, implantation 282 may comprise a single implantation stage, e.g., implantation 282*a* only, implantation 282*b* only, or any other single implantation stage not shown in FIG. 2*c*.

Preferably, implantations 282*a* and 282*b* are tilted, i.e., polar angles $\theta_a$ and $\theta_b$ are preferably less than 180°. The ion beam of implantations 282*a* and 282*b* are preferably performed with a tilted angle since it is desirable that the ion beam reaches a portion of the side walls 270*w* vertically defining the apertures 270. In particular, it is desirable that the upper portion of the side walls 270*w*, i.e., the end portion of the side walls 270*w* in proximity to the aperture edges 270*e*, is affected by the ion implantation 282.

Thus, polar angle $\theta$ of implantation 282 may vary depending on the dimensions of the apertures 270. In particular, polar angle $\theta$ may be chosen as a function of the length and width of the apertures 270, i.e., as a function of the dimensions of the apertures 270 across the horizontal xy-plane.

Furthermore, a maximum penetration height h of implantation 282 may be set in advance as the distance between the exposed upper portion 220*s* of the surface of the insulating layer 220 and the point on the aperture side walls 270*w* affected by implantation 282 lying furthest from the upper surface portion 220*s*. It is here assumed that, after forming the apertures 270, the upper portion 220*s* of the insulating layer 220 continues to lie on a horizontal plane parallel to the xy-plane. Depending on the selected penetration height h and on the dimensions of the apertures 270, the polar angle $\theta$ of implantation 282 may be chosen. In general, a stronger tilting of implantation 282, i.e., a smaller angle $\theta$ or a greater angle $\theta'$, results in a smaller penetration height h with respect to a less tilted ion beam.

For example, one can approximately assume that aperture side walls 270*w* lie along a substantially vertical direction and that they form substantially right angles with the upper portion 220*s* of the exposed surface of the insulating layer 220, as shown in FIG. 2*c*. In this approximation, given a desired maximum penetration height h of implantation 282 and a length l of apertures 270, the following equation may be expected to hold relating polar angle $\theta$, maximum penetration height h and length l: $\sin(\theta)=1/(l^2+h^2)^{1/2}$. Hence, it can be seen that, for a given length l, polar angle $\theta$ increases and complementary polar angle $\theta'$ simultaneously decreases with an increasing maximum penetration height h. In particular, in the schematic approximation of the system shown in FIG. 2*b*, a polar angle $\theta$ of about 135° (i.e., angle $\theta'$ of about 45°) results in a maximum penetration height h approximately equal to the length l of the aperture 270.

The model described above is extremely simplified. In order to define the correct angle $\theta$ to a higher degree of precision, at least three effects should be taken into account: the selectivity of the wet etch rate, the rounding of the top corner and ion scattering on the surface of the side walls 270*w* in holes 270 in case of a large angle $\theta$ (>170°). For the scattering effect, implantation energy and dose are relevant parameters. In general, the model to correctly predict the angle is complex. Therefore, determining angle $\theta$ is to some extent empirically achieved.

According to one embodiment, polar angle $\theta$ of implantation 282 is in the range of 120° to 150° (i.e., $\theta$ in the range of 30° to 60°). In this manner, the maximum penetration height h of implantation 282 may vary in the range of approximately ⅓ to 3l, i.e., in the range of one third of the length l and three times the length l of the aperture 270.

Implantations 282*a* and 282*b* are performed with different azimuth angles $\phi$, which are not shown in FIG. 2*c*. In particular, according to the convention described above with reference to FIG. 3, the azimuth angle of implantation 282*a* is in the range of −90° to 90°, whereas the azimuth angle of implantation 282*b* is in the range of 90° to 270°. By dividing implantation 282 in two or more implantations 282*a*, 282*b*, etc., performed with different azimuth angles from each other, the edges 270*e* and the side walls 270*w* of the apertures 270 may be more homogeneously implanted with impurities of the desired species.

Figure 4B:
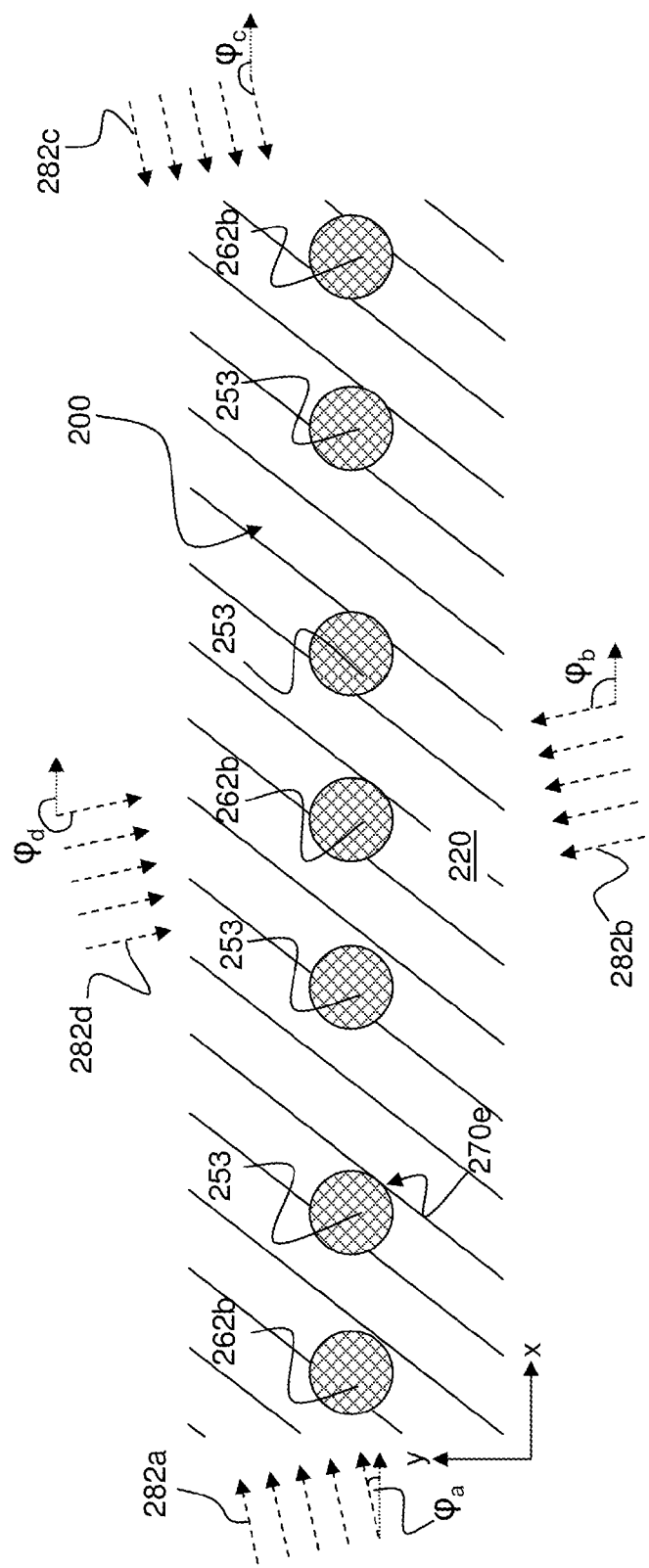
FIG. 4b shows a top view of the semiconductor device undergoing an ion implantation according to an embodiment.

FIG. 4*b* is a top view of the semiconductor device 200 showing an embodiment wherein implantation 282 comprises four implantations 282*a*-282*d* performed at different azimuth angles $\phi_a$-$\phi_d$. More specifically, the direction of implantation 282*a* forms an azimuth angle $\phi_a$ with the x-axis. Although shown in the range of 0° to 90° in FIG. 4*b*, angle $\phi_a$ can assume any value between 0° and 360°. Implantation 282*b* is then performed so that the ion beam direction forms an azimuth angle $\phi_b$ which can be obtained by adding 90° to $\phi_a$. The azimuth angle $\phi_c$ of implantation 282*c* is then obtained by adding 180° to $\phi_a$. Finally, the azimuth angle $\phi_d$ of implantation 282*d* is obtained by adding 270° to $\phi_a$. Thus, angles $\phi_a$-$\phi_d$ form a sequence of angles, wherein each angle after the first one can be obtained by adding 90° to the previous angle.

The embodiment described above with reference to FIG. 4*b* is advantageous since it enables a uniform implantation of impurities into the side walls 270*w* of the apertures 270 across the whole range of azimuth angles. This is particularly desirable in the case of a set of apertures 270 having cylindrical symmetry, such as the situation shown in FIG. 4*b*. However, the four implantations 282a-282d could be advantageously performed also in the case of apertures having, for example, a square, rectangular or a polygonal cross-section.

In one embodiment, the polar angle θ of implantations 282a-282d shown in FIG. 4b is the same for all implantations. In other embodiments, the polar angles of at least two of implantations 282a-282d differ from each other. In one embodiment, the polar angles θ for all implantations 282a-282d may be in the range of 120° to 150°.

Figure 2D:
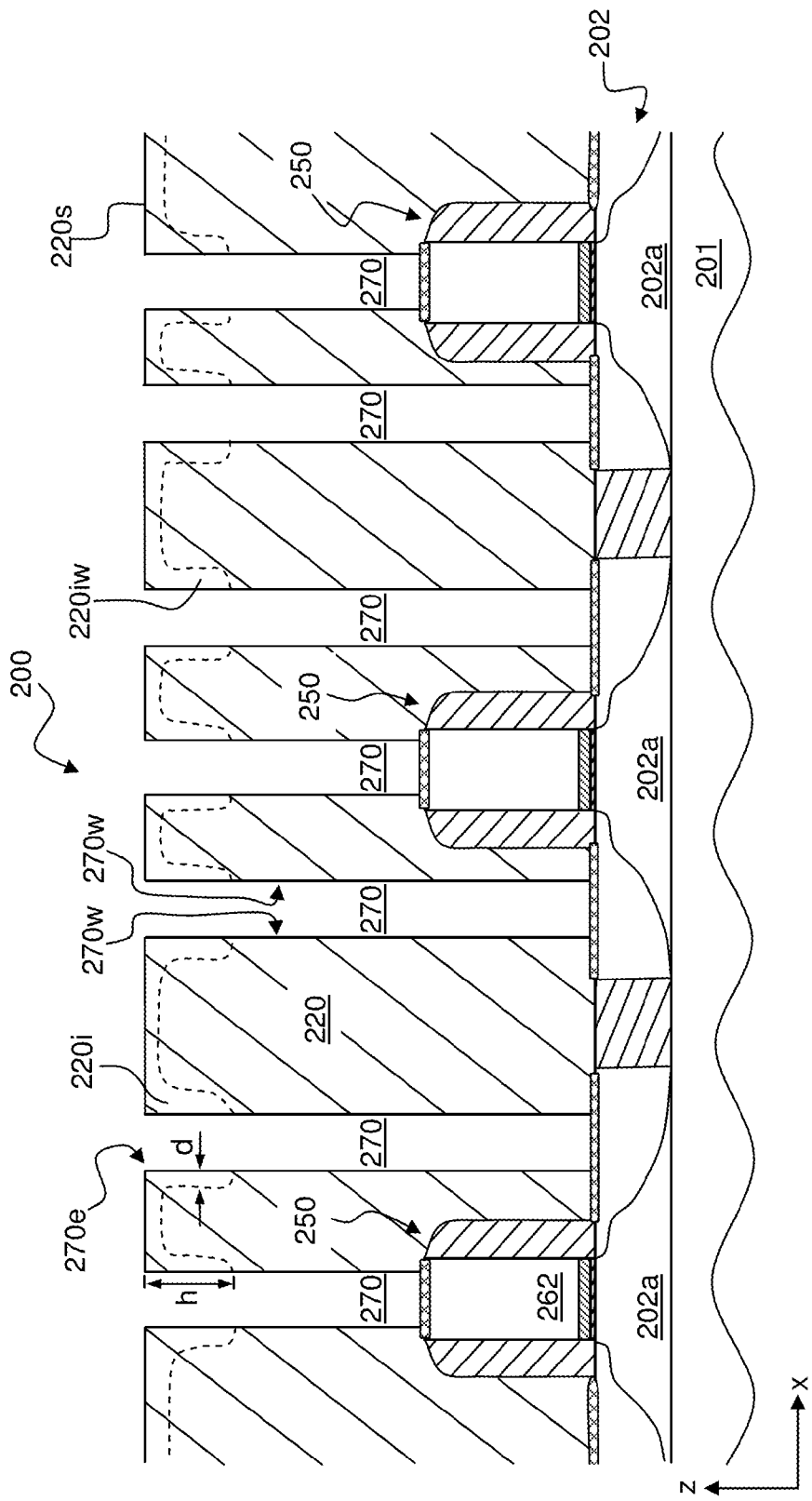

We now refer to FIG. 2d, showing the semiconductor device 200 after performing implantation 282 discussed above with reference to FIGS. 2c and 4b. Implantation 282 causes impurities to be implanted in an upper region 220i of the insulating layer 220 lying adjacent to the surface of the insulating layer 220. The approximate boundary of the region 220i affected by implantation 282 has been marked by a dotted line in FIG. 2d, although it should be understood that a gradual and not a neat boundary is in general established between the implanted and the non-implanted portion of the insulating layer 220.

As shown in FIG. 2d, implantation 282 does not only affect the upper portion 220s of the surface of the insulating layer 220. Rather, region 220i affected by implantation 282 also includes a portion 220iw of the aperture side walls 270w. More precisely, region 220i generally includes an upper portion 220iw of the aperture side walls 270w lying in proximity to the aperture edges 270e. Thus, the aperture edges 270e, defined by the intersection between the aperture side walls 270w and the upper portion 220s of the surface of the insulating layer 220, are also necessarily affected by implantation 282.

The shape of the implanted region 220i may be adjusted by selecting appropriate parameters for the implantation 282. As discussed above, the maximum penetration height h of implantation 282 crucially depends on the polar angle θ formed by the direction of the ion beam used in the implantation 282 with the vertical z-axis.

The shape of the implanted region 220i is also characterized by the penetration depth d, i.e., the maximum distance from the exposed surface reached by the implanted ions within the insulating layer 220. Penetration depth d depends on several implantation parameters, such as: the implanted species, the energy of the ion beam, the implantation dose. The penetration depth is preferably in the range of 2-10 nm. For example, the implantation 282 may be performed at an energy in the range of 1-10 keV when nitrogen is deposited. In general, implant parameters, such as implanted species, energy, dose, etc., depend strongly on the application.

Figure 2E:
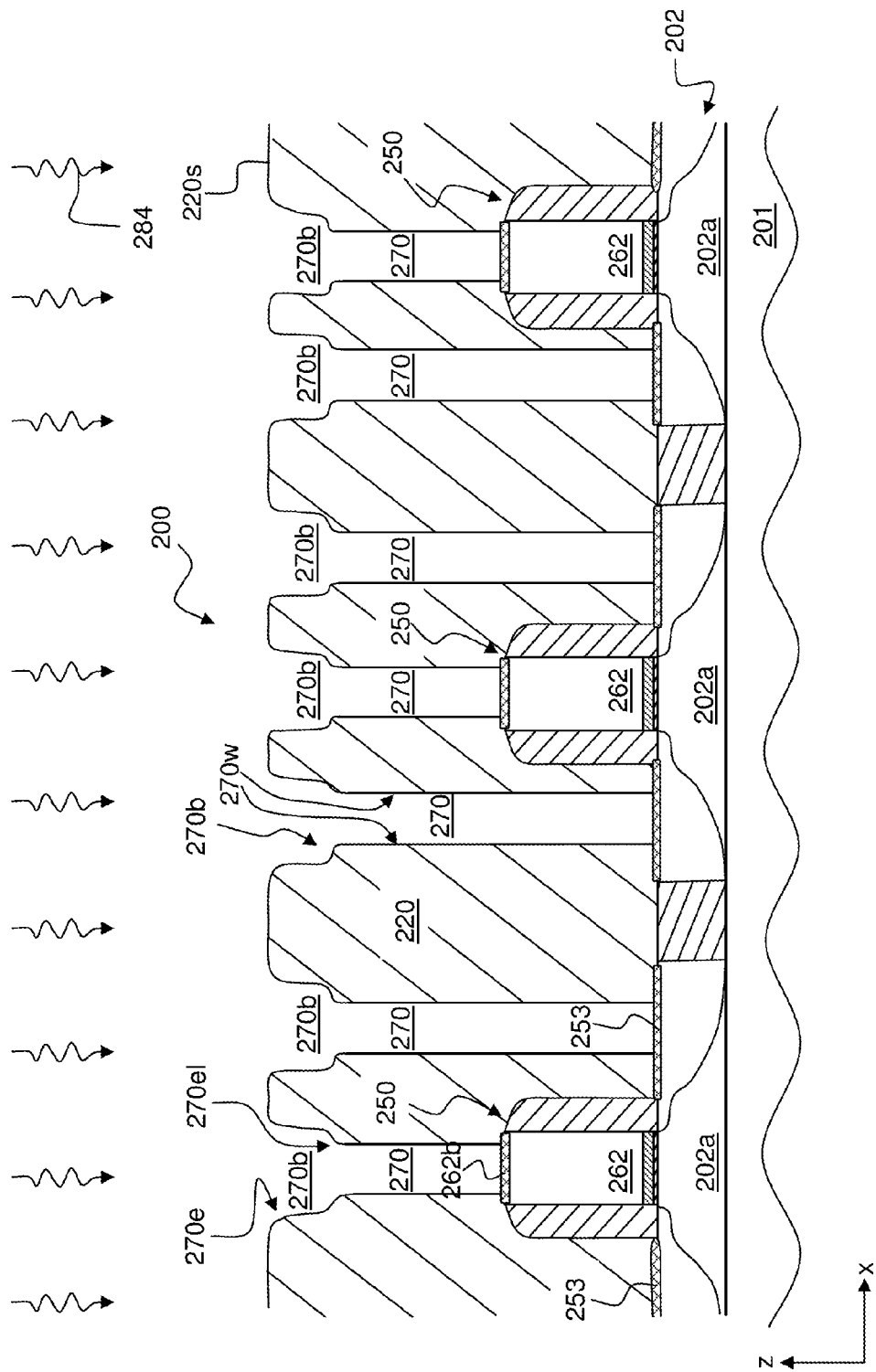

FIG. 2e shows semiconductor device 200 during a stage in the manufacturing flow subsequent to that shown in FIG. 2d. As shown in FIG. 2e, the semiconductor device 200 undergoes an etch process 284 after performing the implantation 282. According to one embodiment, the etch process 284 and the ion implantation 282 are chosen so that the implanted region 220i (see FIG. 2d) of the insulating layer 220 is etched at a different rate from the remaining non-implanted portion. According to a particular embodiment, the etch process 284 is such that the region 220i of the insulating layer 220 affected by the implantation 282 is etched at a higher rate than the remaining portion of the insulating layer 220 not affected by the implantation 282.

In this manner, the etch 284 may be chosen so that the whole implanted region 220i may be selectively removed by the etch 284. Depending on the etch parameters, a relatively thin layer of the non-implanted portion of the insulating layer 220 may also be removed, namely a layer lying adjacent to the boundary with the implanted region 220i.

FIG. 2e shows the configuration of the semiconductor device 200 after performing the etch 284. In general, the etch 284 does not remove the whole insulating layer 220. Rather, it is desirable that the etch 284 selectively removes an upper portion of the insulating layer 220, whereas the remaining portion of the insulating layer 220 is not affected by the etch 284. The portion of the insulating layer 220 removed by the etch 284 preferably comprises a portion of the implanted region 220i.

Due to the different etch rates between implanted and non-implanted portions, etch the 282 results in the formation of an enlarged portion 270b of an aperture 270 in correspondence to the aperture edge 270e. Enlarged portions 270b are formed due to tapering of the upper portion of the insulating layer 220 brought about by the etch 284. The top of an enlarged portion 270b is defined by a respective aperture edge 270e, which is enlarged after performing the etch 284. Furthermore, the bottom of the enlarged portion 270b is coincident with a lower edge 270el, defined by the boundary between the tapered and the non-tapered portion of the insulating layer 220.

The depth of the enlarged portion 270b of the apertures 270, i.e., the distance along the vertical z-axis between the upper edge 270e and the lower edge 270el, depends on the maximum penetration height h of implantation 282. In general, all other parameters of implantation 282 and etch 284 being equal, the greater the maximum penetration height h is, the deeper is the enlarged portion 270b. This proportionality relation also depends on other parameters, such as the parameters of the etch 284. For example, the parameters of the etch 284 may be chosen so that the depth of the enlarged portion 270b is equal to or greater than the maximum penetration height h.

On the other hand, the length and width of the enlarged portion 270b of the aperture 270, i.e., the extension across the horizontal xy-plane of a cross-section of the enlarged portion 270b, in general depends on the penetration depth d of the implantation 282. In particular, a greater penetration depth d results in a greater width or length of the enlarged portion 270b.

Thus, by adjusting the parameters of the implantation 282, the shape of the implanted region 220i of the insulating layer may be adjusted, which in turn determines the shape of the enlarged portions 270b of the apertures 270. It is observed that the shape of the enlarged portions 270b is also affected by the choice of the parameters characterizing the etch 284.

In general, the sequence of implantation 282 and etch 284 results in a rounding effect of the corners included in edges 270e of the apertures 270. This effect reduces the aspect ratio of the apertures 270, thereby rendering the deposition of a metal into the apertures 270 easier and more precise.

In one embodiment, the etch 284 comprises a wet etch. In a particular embodiment, the etch 284 comprises immersing the semiconductor device 200 in a liquid solution of ammonium hydroxide (NH$_4$OH) in a solvent. Preferably, the solvent is inorganic and may advantageously be water. For example, the semiconductor device 200 may be soaked in the solution comprising NH$_4$OH for a time interval between 10 and 20 minutes and, preferably, of about 15 minutes. In one embodiment, the etch 284 comprises a standard cleaning procedure for silicon wafers or substrates, such as the SC1 procedure. In some embodiments, SC1 is performed at a temperature higher than room temperature, so as to increase the difference in etch rate between the implanted and non-implanted portions of insulating layer 220.

According to a further embodiment, the etch 284 comprises immersing the semiconductor device 200 in a liquid solution of hydrofluoric acid (HF) in a solvent. As above, an inorganic solvent is preferred. For example, the solvent may be water. The solution of HF may be diluted. For example, a 2% solution of HF may be used. The semiconductor device 200 may be soaked in the solution of HF for a time interval between 1 and 5 minutes and, preferably, for about 2 minutes.

Thus, the etch 284 is preferably a wet etch and may comprise a standard cleaning procedure usually performed on the surface of the substrate or of the semiconductor device to be formed, such as, for example, a SC1 procedure or a dilute HF cleaning. It is observed that standard cleaning procedures are routinely performed on semiconductor wafers during a manufacturing flow in order to remove impurities or undesired particles off the substrate surface. Thus, the claimed method allows one or more standard cleaning procedures to be used for the additional purpose of smoothing the edges of apertures 270 in the insulating layer 220. In other words, a dedicated etch step for achieving the edge-rounding effect is not necessary, since this may be replaced by a standard cleaning procedure such as, for example, SC1 and/or a dilute HF cleaning In particular, it is pointed out that, due to the presence of implanted ions in the insulating layer 220, the etch 284 does not have to be performed by using a "strong" technique, such as a plasma-etch, to achieve the desired effect. Rather, a "softer" etching process, such as a wet etch, is sufficient for removing an upper portion of the apertures 270 and obtain smoother, tilted aperture edges. Wet etches, such as those used in standard cleaning procedures, do not harm sensitive parts of a semiconductor device exposed thereto. Thus, the etch 284 according to the claimed method does not require a plasma-etch, which could damage exposed portions of the semiconductor device such as, for example, metal silicide layers 253 and 262b shown in FIG. 2e.

FIG. 4c shows a top view of the semiconductor device 200 shown in FIG. 2e according to a particular embodiment wherein apertures 270 have a cylindrical symmetry. According to the embodiment shown in FIG. 4c, the etch 284 results in formation of enlarged portions of the apertures 270 also having a cylindrical symmetry. The lower edge 270el, limiting the enlarged portions on the lower side, has a circular profile. The lower edge 270el substantially corresponds to the edge 270e of the apertures 270 before performing the etch 284 and shown, for example, in FIG. 4a. The upper edge 270e shown in FIG. 4c, limiting aperture 270 on the upper side, also has a circular profile concentric to the lower edge 270el. However, the radius of the upper edge 270e is greater than the radius of the lower edge 270el.

The configuration shown in FIG. 4c may have been obtained by performing the implantation 282 in different stages before applying the etch 284. Each stage of the implantation 282 may have been advantageously performed with a different azimuth angle ϕ from all other stages, so as to evenly distribute the implanted ions across the whole range spanned by azimuth angle ϕ. For example, the configuration shown in FIG. 4c may have been obtained by performing a sequence of implantations 282 such as implantations 282a-282d shown in FIG. 4b, followed by etch 284.

Figure 2F:
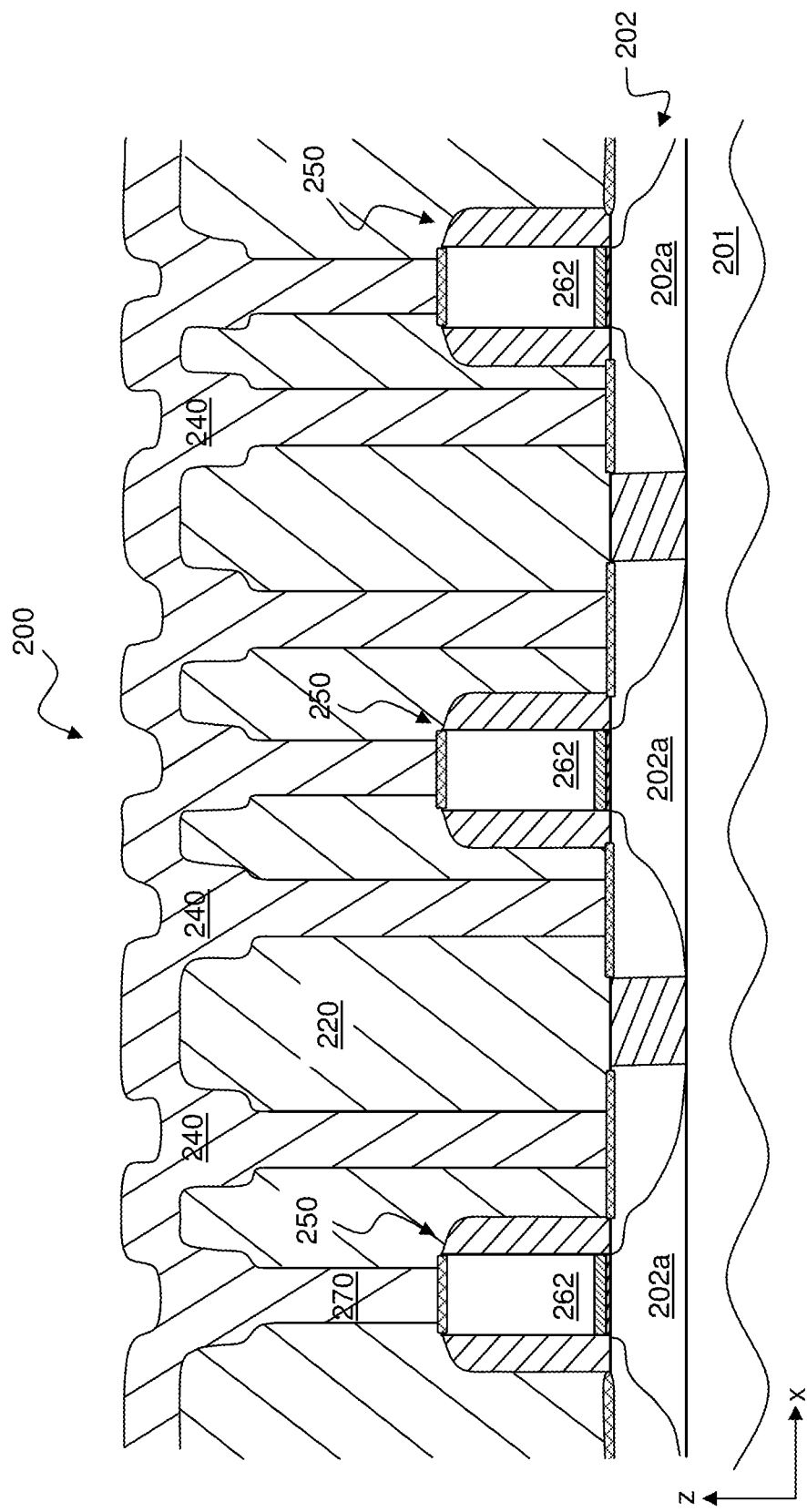

FIG. 2f shows the semiconductor device 200 in a subsequent fabrication stage to that shown in FIG. 2e. After performing the etch 284, a metal layer 240 is deposited on the surface of the semiconductor device 220. The deposited metal may comprise copper. Other metals may also be deposited, such as, for example, tungsten, aluminum and the like.

The invention is particularly suitable for metal fill processes likely resulting in grain formation, like in the case of tungsten. In these cases, the proposed method enables homogeneous metal filling by hindering grain formation.

The deposition method may comprise an electrochemical technique such as electroplating or electroless plating. Electrochemical techniques are preferred when depositing copper or copper alloys. If electrochemical techniques are used, the composition and the kinetics of the species within an electrolyte bath may be controlled so as to yield a highly non-conformal deposition behavior. This is desirable in order to fill the apertures 270 with metal. Alternatively, a standard deposition technique may be used such as, for example, chemical vapor deposition (CVD).

It is noted that, due to the smoothed edges and the enlarged upper portion of the apertures 270, the metal layer 240 may be deposited in the apertures 270 without forming defects or irregularities, such as voids.

Figure 2G:
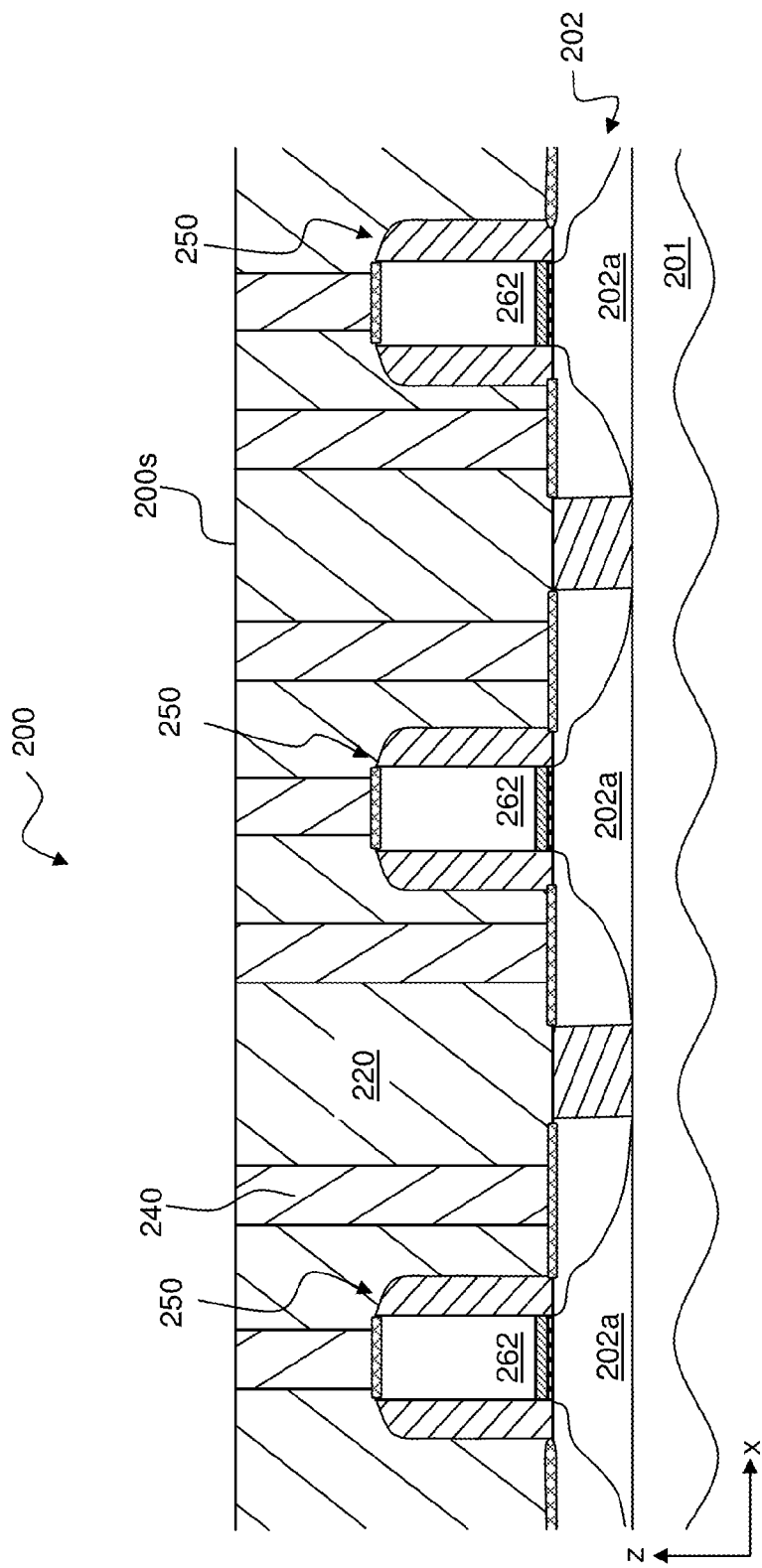

Thereafter, as shown in FIG. 2g, the excess metal and, where needed, an upper portion of the insulating layer 220, may be removed. Removal may be achieved, for example, by chemical mechanical polishing. A capping layer (not shown) acting as a polish stop layer may be included in the insulating layer 220 in order to adjust the material removal process. After completion of the removal process, the semiconductor device 220 exposes a substantially flat surface 200s including portions of the metal layer 240 alternated to portions of insulating layer 220. It is observed that the metallic portions on the surface 200s enable an electrical contact to the source and drain regions as well as to the gate electrodes of transistors 250 included in the semiconductor device 200.

The present invention thus provides a method of forming apertures, such as holes and trenches, in an insulating layer which may effectively be filled with a metal. The invention may be advantageously applied to apertures having a high aspect ratio. This is often the case when forming apertures in an interlayer dielectric for contacting metal pads on a semiconductor device, for example, when contacting the source and drain regions and/or the gate electrode of a transistor. Apertures may also be formed in order to contact metal lines of a metallization layer.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    forming a transistor structure comprising a gate electrode, a source region and a drain region in and above a semiconductor layer;
    forming an insulating layer above the surface of said semiconductor layer after forming said transistor structure;
    performing a first etch process in order to form at least one opening in a predetermined portion of said insulating layer;
    performing an ion implantation so as to implant impurity ions into an upper portion of said insulating layer; and
    performing a second etch process so as to remove at least a portion of said insulating layer comprising the implanted impurity ions after performing said ion implantation;
    wherein during said second etch process said upper portion of said insulating layer comprising the implanted impurity ions is etched at a different rate from the remaining portion of said insulating layer.

2. The method of claim 1, wherein said second etch process is such that the etch rate of said insulating layer is higher in the portion of the insulating layer comprising the implanted impurity ions and lower in areas of the insulating layer not containing the implanted impurity ions.

3. The method of claim 1, wherein said transistor is part of a semiconductor device that comprises at least a residual portion of said insulating layer after performing said second etch.

4. The method of claim 1, wherein said second etch process comprises a wet etch.

5. The method of claim 1, wherein said second etch process comprises treating said semiconductor device with a solution containing at least one of hydrofluoric acid (HF) and ammonium hydroxide ($NH_4OH$).

6. The method of claim 1, wherein said second etch process results in an upper portion of said opening being wider than a width of a remaining portion of said aperture.

7. The method of claim 1, wherein said impurity ions implanted by performing said ion implantation comprise germanium or nitrogen ions.

8. The method of claim 1, wherein said ion implantation is performed at a beam energy in the range of about 1 to about 10 keV.

9. The method of claim 1, wherein said ion implantation is performed at a dose of about $10^{13}$ to $10^{14}$ $cm^{-2}$.

10. The method of claim 1, wherein the direction of the ion beam used for performing said implantation forms an angle different from zero with the normal direction to the surface of said semiconductor layer.

11. The method of claim 1, wherein said ion implantation comprises at least a first ion implantation performed with an ion beam directed along a first direction and a second ion implantation performed with an ion beam directed along a second direction, said first and second direction having different azimuth angles, given a longitudinal axis parallel to the normal direction to the surface of said semiconductor layer.

12. The method of claim 1, wherein said ion implantation is performed after said first etch process.

13. The method of claim 1, wherein said first etch process comprises an anisotropic etch.

14. The method of claim 1, wherein said at least one opening exposes a predetermined portion of the surface of said transistor structure.

15. The method of claim 1, further comprising, after performing said second etch process, depositing a metal so as to fill said at least one opening with said metal.

16. The method of claim 15, wherein said deposition comprises an electrochemical technique.

17. The method of claim 15, wherein said deposited metal comprises copper or tungsten.

18. The method of claim 15 further comprising performing a surface polishing process so as to remove at least a surface portion of said metal.

19. A method, comprising:
forming a transistor structure comprising a gate electrode, a source region and a drain region in and above a semiconductor layer;
forming an insulating layer above the surface of said semiconductor layer after forming said transistor structure;
performing a first anisotropic etch process in order to form at least one opening in a predetermined portion of said insulating layer;
performing an angled ion implantation process so as to implant impurity ions into an upper portion of said insulating layer adjacent said opening; and
performing a second etch process so as to remove at least a portion of said insulating layer comprising the implanted impurity ions after performing said angled ion implantation, wherein said second etch process results in an upper portion of said opening being wider than a width of a remaining portion of said aperture.

20. The method of claim 19, wherein during said second etch process said upper portion of said insulating layer comprising the implanted impurity ions is etched at a different rate from the remaining portion of said insulating layer.

21. The method of claim 19, wherein said second etch process is such that the etch rate of said insulating layer is higher in the portion of the insulating layer comprising the implanted impurity ions and lower in areas of the insulating layer not containing the implanted impurity ions.

22. The method of claim 19, wherein said second etch process comprises a wet etch process.

* * * * *